United States Patent [19]

Sunouchi et al.

[11] Patent Number: 5,488,242
[45] Date of Patent: Jan. 30, 1996

[54] SEMICONDUCTOR MEMORY DEVICE

[75] Inventors: Kazumasa Sunouchi, Yokohama; Hiroshi Takato, Kawasaki; Tohru Ozaki; Naoko Okabe, both of Tokyo; Katsuhiko Hieda, Yokohama; Fumio Horiguchi, Tokyo; Akihiro Nitayama; Takashi Yamada, both of Kawasaki; Kouji Hasimoto, Yokohama; Satosi Inoue, Suwa, all of Japan

[73] Assignee: Kabushiki Kaisha Toshiba, Kawasaki, Japan

[21] Appl. No.: 156,931

[22] Filed: Nov. 24, 1993

Related U.S. Application Data

[63] Continuation of Ser. No. 620,482, Nov. 29, 1990, abandoned.

[30] Foreign Application Priority Data

Nov. 30, 1989 [JP] Japan .................................. 1-312192

[51] Int. Cl.⁶ .......................... H01L 29/78; H01L 29/92; H01L 27/02; H01L 29/68
[52] U.S. Cl. .......................... 257/301; 257/303; 257/350; 257/382; 257/534; 257/622
[58] Field of Search ................... 357/51, 23.6; 257/301, 257/303, 350, 382, 534, 622

[56] References Cited

U.S. PATENT DOCUMENTS

| 4,734,384 | 3/1988 | Tsuchiya | 257/301 |
| 4,980,734 | 12/1990 | Inoue | 357/23.6 |
| 5,047,815 | 8/1991 | Yasuhira et al. | 357/23.6 |

FOREIGN PATENT DOCUMENTS 61-67954  4/1986  Japan .

*Primary Examiner*—Rolf Hille
*Assistant Examiner*—Valencia Martin Wallace
*Attorney, Agent, or Firm*—Finnegan, Henderson, Farabow, Garrett & Dunner

[57] ABSTRACT

In a DRAM having a structure in which a storage node electrode is formed via an insulator film in a trench formed in a memory cell region to thereby form a capacitor, and in which the storage node electrode is connected in the source/drain regions of a MOSFET through a storage node contact formed in a part of the insulator film, the trench is disposed so as to deviate widthwise in a channel region of the MOSFET, so that the distance between adjacent element regions is reduced without causing misalignment of masks used in the formation of the storage node contact, thereby to provide a miniaturized high-reliability DRAM. In addition, the storage node contact and the trench can be formed in large size.

11 Claims, 13 Drawing Sheets

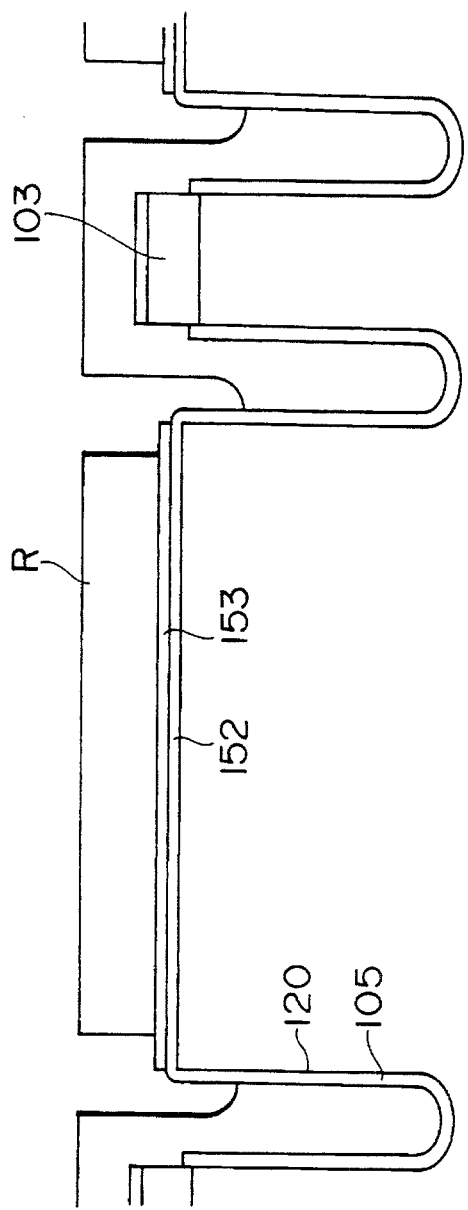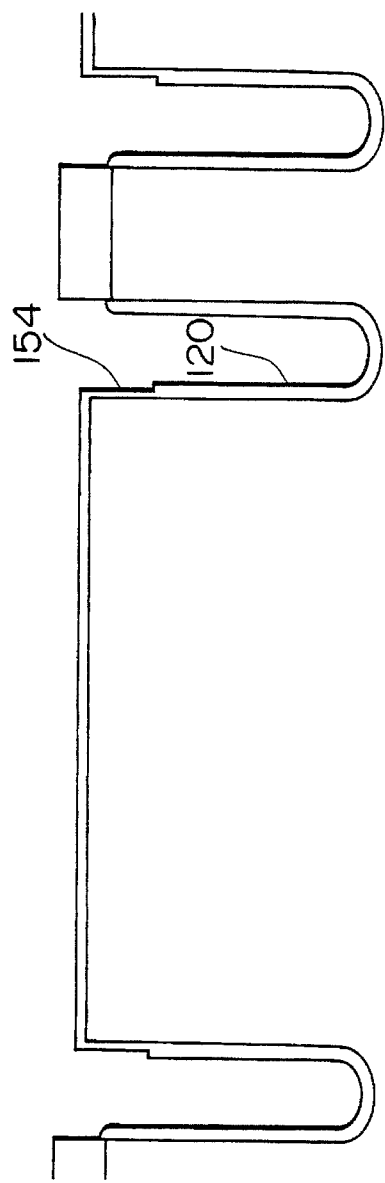
FIG.3(a)
FIG.3(b)

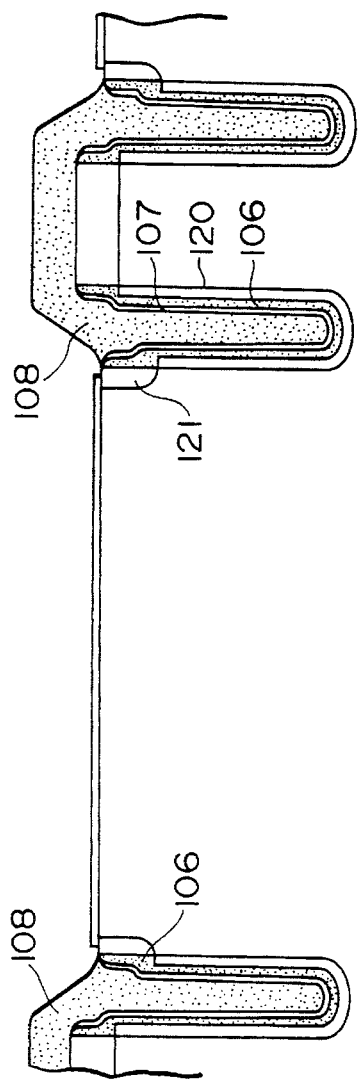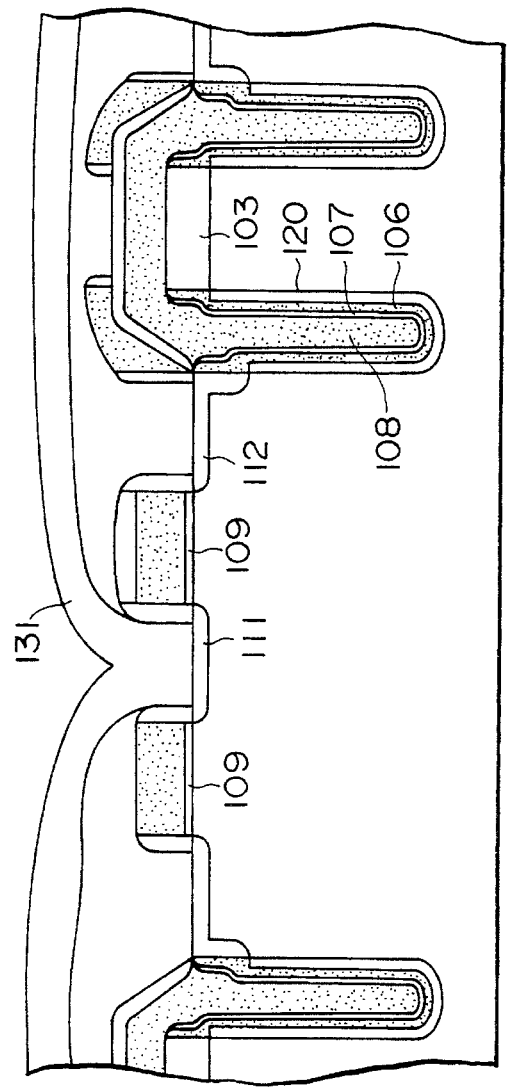

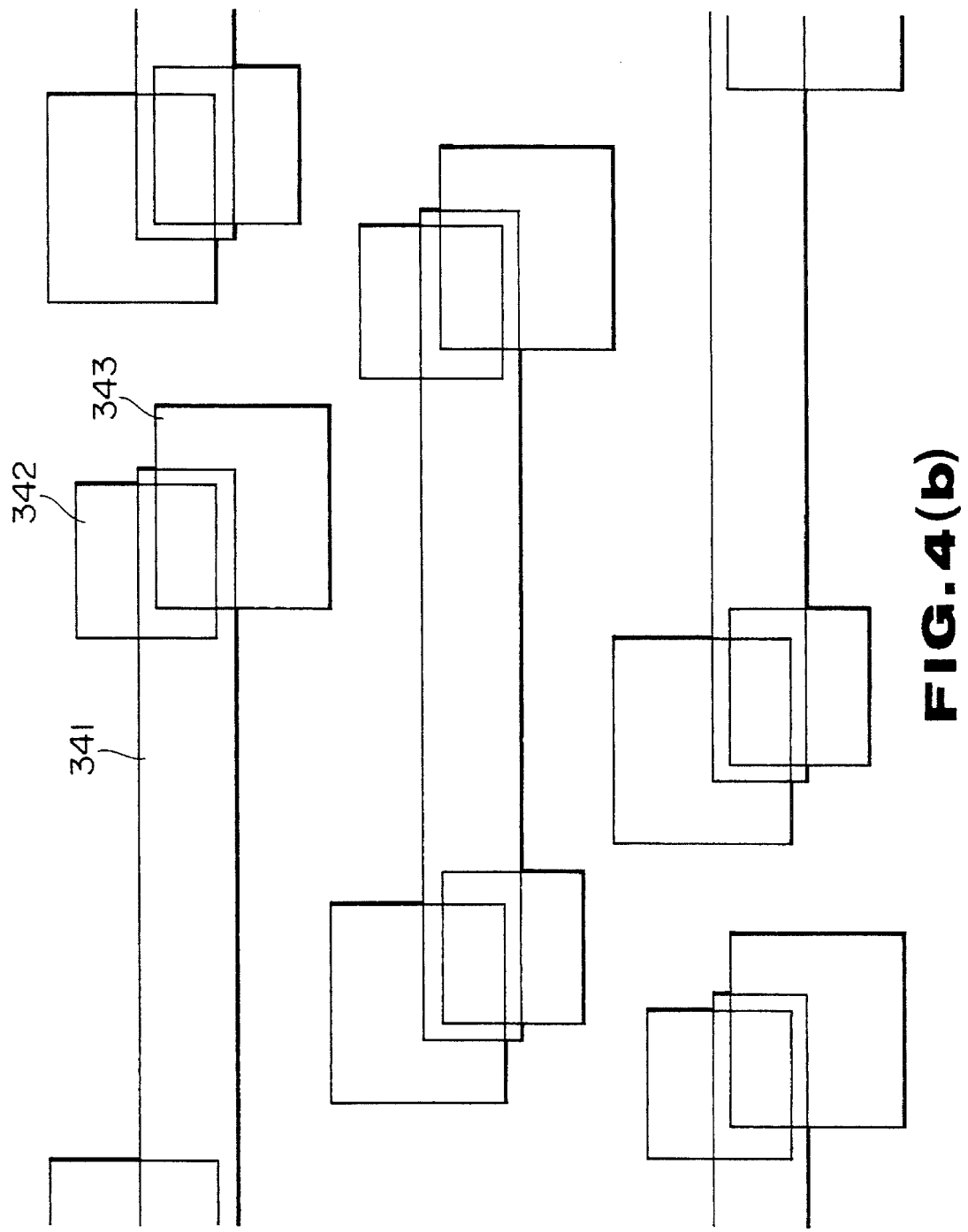

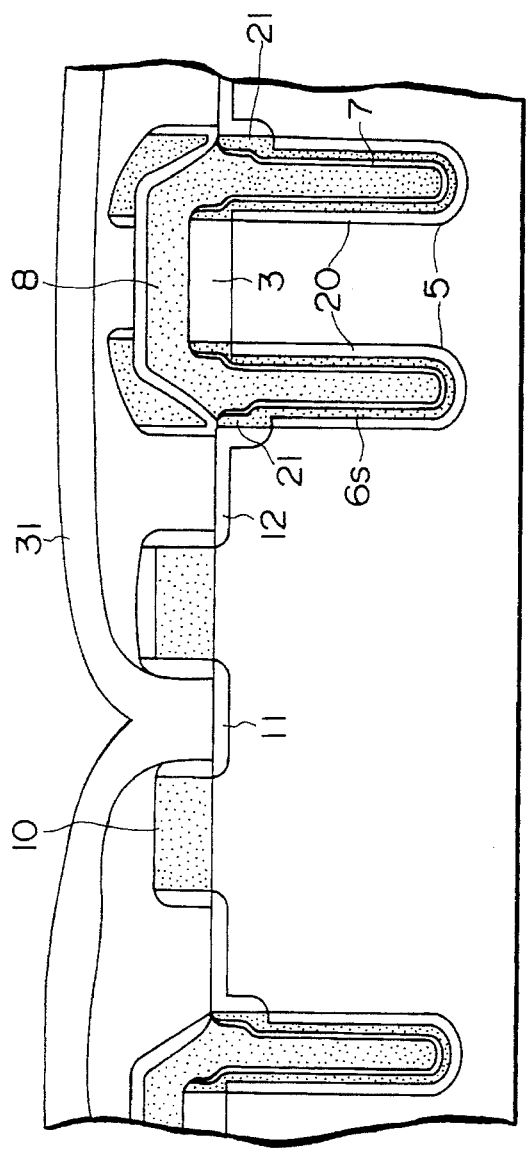
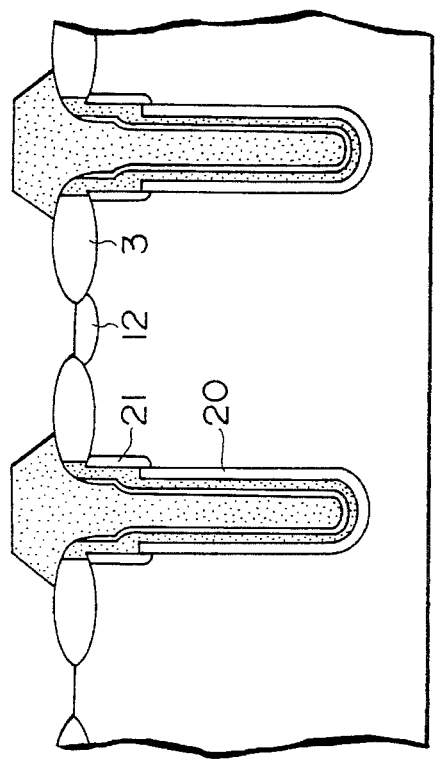
FIG. 7(b) (PRIOR ART)
FIG. 7(c) (PRIOR ART)

SEMICONDUCTOR MEMORY DEVICE

This application is a continuation of application Ser. No. 07/620,482, filed Nov. 29, 1990, now abandoned.

FIELD OF THE INVENTION

The present invention relates to a semiconductor memory device and a method of manufacturing same and more particularly to a dynamic RAM (DRAM) of a trench type capacitor structure and a method of manufacturing same.

BACKGROUND ART

Recently, semiconductor memory devices increase steadily both in their integration degree and capacity. Research has been conducted for miniaturization of memory cells in a MOS dynamic RAM (DRAM) comprising a single MOSFET and a single MOS capacitor.

Due to the miniaturization of the memory cells, however, the area of the capacitor for storing information (electric charges) is reduced. As a result, soft errors such as misreading of the contents of the memory device or breakage of the contents of the memory device by α-rays have become problems to be solved.

Various methods have been proposed to increase integration degree and capacity while preventing the soft errors. In the methods, efforts have been made to substantially increase the capacity of the capacitor and hence a quantity of electric charges stored without increasing the area occupied by the capacitor.

One proposal is a DRAM having the following trench type capacitor structure.

A plan view and a cross-sectional view of such DRAM is shown in FIGS. 6(a) and 6(b). in which the DRAM comprises trenches 3 ($3_1$, $3_2$, . . . ) formed in a surface of a p-type silicon substrate 1 and n-type layers 6 ($6_1$, $6_2$, . . . ) formed on the inner walls of the trenches 5, capacitor insulator films 7 and plate electrodes 8 embedded in this order on the surfaces of the n-type layers to form capacitors. With this structure, the area (capacity) of the capacitor is increased without increasing the size of the capacitor.

Each MOSFET comprises source/drain regions 11 ($11_1$, $11_2$, . . . ) and 12 ($12_1$, $12_2$, . . . ) of an n-type layer and a gate electrode 10 ($10_1$, $10_2$, . . . ), a gate insulator film 9 being formed between the source/drain regions 11 and 12 and the gate electrode 10, and formed within an element region defined by a field oxide film 3 which is formed on the surface of the silicon substrate 1. Each MOS capacitor comprises an n-type layer 6 disposed on the inner wall of an adjacent trench 5 and connected to the n-type layer source/drain region 11 ($11_1$, $11_2$, . . . ) and 12 ($12_1$, $12_2$, . . . ), a capacitor insulator film 7 formed on the surface of the n-type layer 6 and a plate electrode 8 embedded in the trench 5.

In this structure, the inner wall of the trench 5 is used to form the MOS capacitor. Therefore, the capacity of the capacitor is increased several times as large as that of a planar structure. Thus, this structure prevents a decrease in a quantity of electric charges stored in the memory cell even if the area occupied by the memory cell is reduced. Accordingly, this structure provides a small-sized DRAM having a large capacity of memory device.

With the above-described structure, however, as the distance between the trenches $5_1$ and $5_2$ of adjacent memory cells is reduced, stored electric charges (information) are likely to be lost by punch-through, which causes an error in the stored data.

This error occurs in a situation where information charges are stored in the n-type layer $6_1$ of one trench $5_1$ and no information charges are stored in the n-type layer $6_2$ of the other trench $5_2$. In such situation, the information charges stored in the n-type layer $6_1$ move to the other n-type layer $6_2$. As the depth of the trench increases, the error is more likely to occur. This is because as the trench becomes deeper, the length for the horizontal diffusion in the n-type layer 6 increases, so that the distance between adjacent n-type layers becomes relatively reduced.

Therefore, if a trench is, for example, 5 μm deep, it is very difficult to reduce the distance between the adjacent trenches to 1.5 μm or less.

This has become a big problem which prevents a further increase in the integration degree of DRAMs.

Referring to FIGS. 7(a)–7(c), (FIG. 7(b) is a cross-sectional view taken along the line 7(b)—7(b) of FIG. 7(a), and FIG. 7(c) is a cross-sectional view taken along the line 7(c)—7(c) of FIG. 7(a)), a structure is proposed in order to solve the above problem. In the structure, a capacitor is formed by sequentially forming a storage node electrode 6s, a capacitor insulator film 7 and a plate electrode 8 provided via an insulator film 20 on the inner wall of a trench 5 (Refer to Unexamined Japanese Patent Publication Sho 61-67954). The numeral 21 denotes an n-type layer which connects the storage node electrode 6s to an n-type layer 12 which constitutes the source/drain regions, and 31 denotes a bit line.

Each of the trench 5 and a storage node contact 42 which is formed in the insulator film 20 provided on the trench inner wall for connecting the n-type layer 21 to the storage node electrode 6s is disposed symmetrical with reference to the element region 51 surrounded by the element separating insulator film. FIG. 8 shows the positional relationship between an opening 743 in a mask pattern of the trench and an opening 742 in the storage node contact with respect to an opening 741 in a mask pattern f-or the element regions.

Since the trench inner wall is covered with the insulator film 20 in this structure, leakage due to punch-through is not likely to occur even if the distance between the adjacent trenches is reduced, which would otherwise occur between the n-type layers $6_1$ and $6_2$ as in the structure of FIG. 6.

However, leakage may possibly occur between a cell element region (source/drain region 12) and an adjacent n-type layer 21 which is formed in the trench inner wall and connects the storage node electrode 6S and the n-type layer 12 for the source/drain regions.

The storage node contact 42 which is formed in the insulator film 20 provided on the trench inner wall and connects the n-type layer 21 to the storage node electrode 6S is formed by patterning in the form of a very small hole. If a mask used for the patterning is misaligned, leakage is likely to occur.

As described above, there is a possibly of leakage between the n-type layer 21 and the element region (source and drain region 12) of an adjacent cell in the conventional trench type capacitor structure. Therefore, the distance t (FIG. 7(a)) between the storage node contact and the adjacent element region cannot be reduced greatly. Further, it is required very strict resolution and alignment in patterning the storage node contact.

SUMMARY OF THE INVENTION

The present invention has been made in view of the above situation, and therefore it is an object of the present invention to provide a semiconductor memory device of a trench type capacitor structure capable of preventing leakage between the n-type layer for the storage node contact and the element region (source/drain region) of an adjacent cell even if its element areas is miniaturized.

The present invention is a DRAM having a structure in which a storage node electrode is formed via an insulator film in a trench formed in a memory cell region to form a capacitor and in which the storage node electrode is connected to a source/drain region of a MOSFET through a contact formed in part of the insulator film, characterized in that the trench is disposed so as to deviate widthwise of a channel in the MOSFET.

Preferably, the storage node contact is disposed so as to deviate in the direction opposite to the direction in which the trench deviates.

According to such structure, the trench is disposed so as to deviate widthwise of the channel in the MOSFET, so that the distance between the adjacent cell element regions (source/drain region) is increased. Thus, it is unnecessary to allow for misalignment of masks used in forming the storage node contact and the distance between the adjacent element regions is reduced.

In addition, the storage node contact and trench are patterned in large size.

In the above structure of the memory calls, reliability is further improved by forming the storage node contact so as to deviate in the direction opposite to the direction in which trench deviates.

BRIEF DESCRIPTION OF THE DRAWINGS

In the accompanying drawings:

FIGS. 3(a)–3(d) illustrate the steps of manufacturing a DRAM having a trench-type memory cell structure of FIG. 1;

FIGS. 4(a) and 4(b) and FIGS. 5(a) and 5(b) show modifications of the present invention;

FIGS. 6(a)–6(b) and FIG. 7(a)–7(c) illustrate a conventional DRAM including a trench type memory cell structure.

DESCRIPTION OF THE PREFERRED EMBODIMENTS

Embodiments of the present invention will be described in detail with reference to the drawings.

Figure 1A:
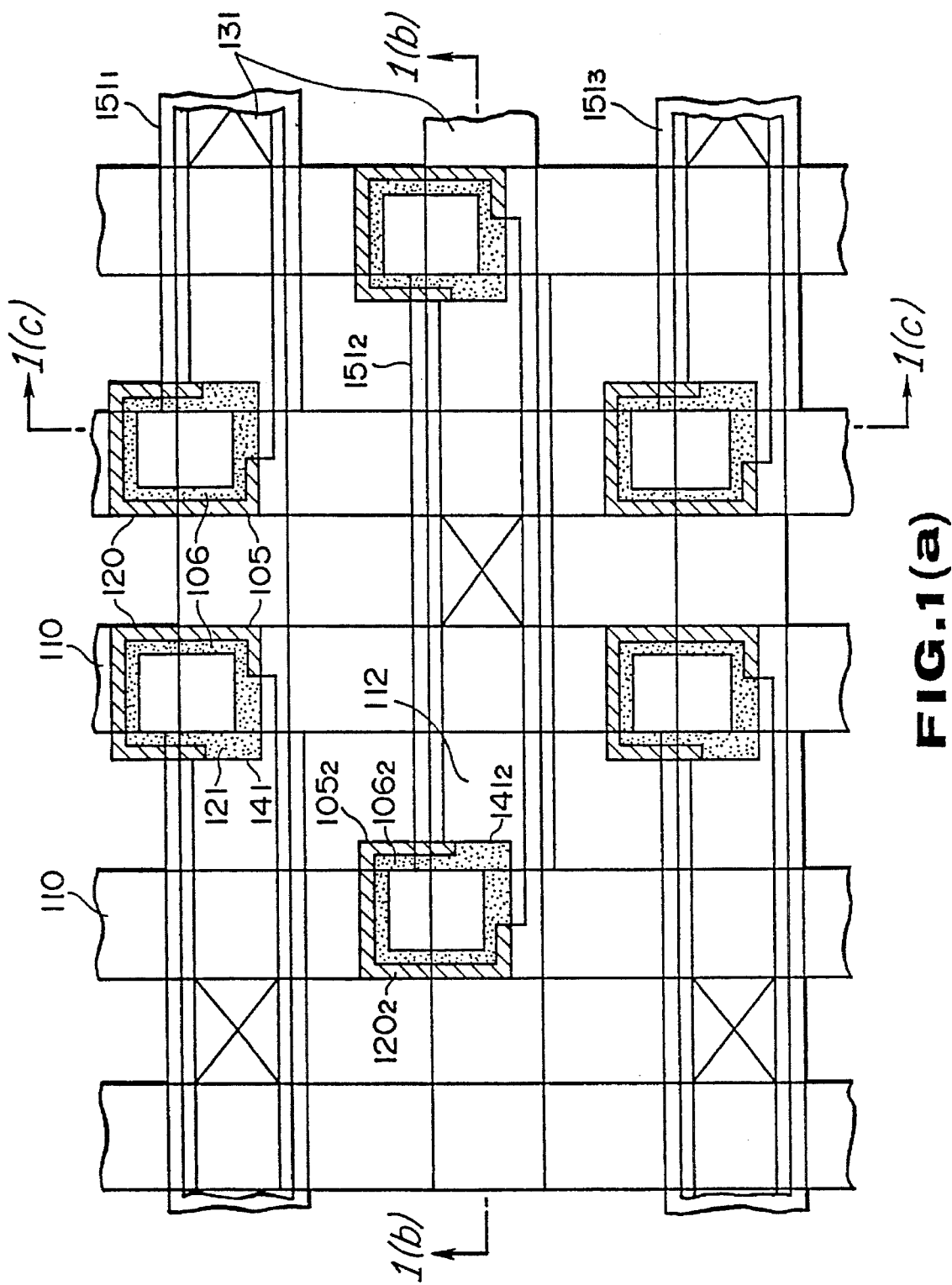
FIGS. 1(a)–1(c) illustrate a DRAM of an embodiment of the present invention.
Figure 1B:
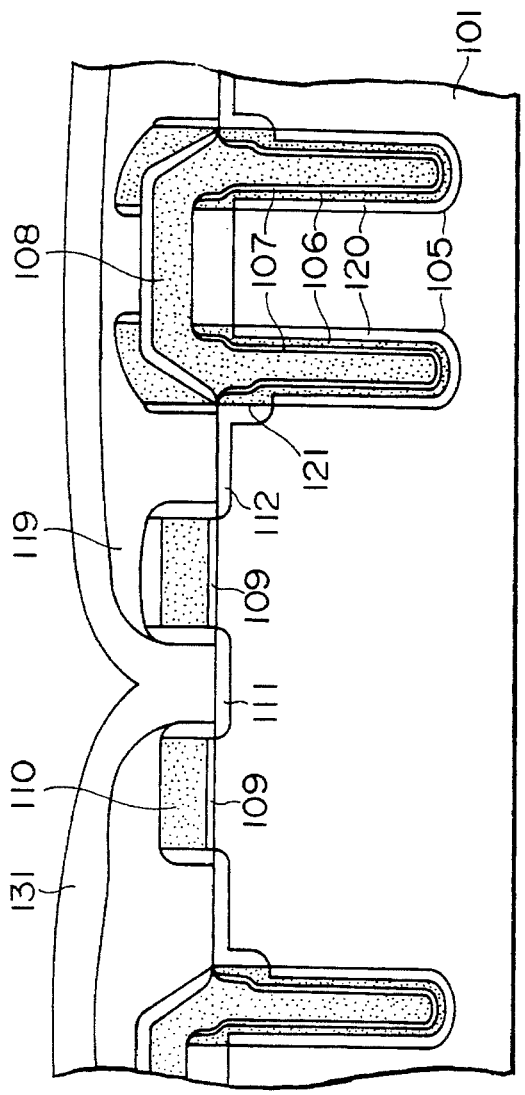
Figure 1C:
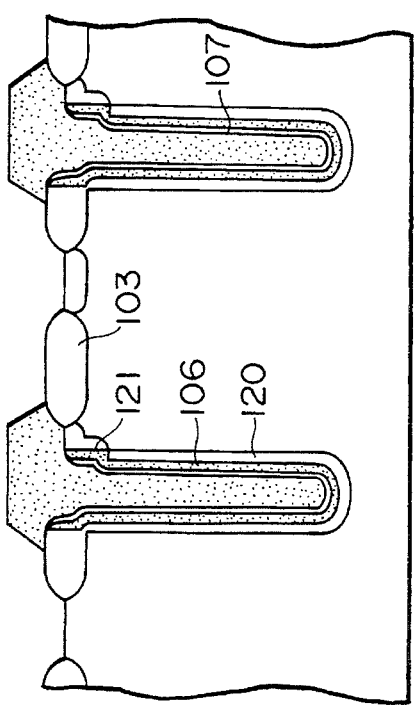

FIGS. 1(a), 1(b) and 1(c) are a plan view of a DRAM having a trench structure of a first embodiment of a semiconductor storage device according to the present invention, a cross-sectional view taken along the line 1(b)–1(b) of FIG. 1(a) and a cross-sectional view taken along the line 1(c)–1(c) of FIG. 1(a), respectively.

The DRAM includes element regions $151_1$, $151_2$, . . . separated from each other by an element separating insulator film 103 formed on a surface of a p-type silicon substrate 101, trenches $105_1$, $105_2$, . . . arranged to deviate from the element regions and storage node contacts 141 deviated from the corresponding element regions in the direction opposite to the direction in which the trenches deviate. The remaining portions or elements of the DRAM are the same as those of a conventional DRAM. More particularly, referring to FIG. 1(a), the trench $105_2$ formed in the element region $151_2$ deviates from a longitudinal centerline (not shown) of the element region $151_2$ toward the element region $151_1$ and the storage node contact $141_2$ deviates from the longitudinal centerline of the element region toward the element region $151_3$ in the trench.

Figure 2:
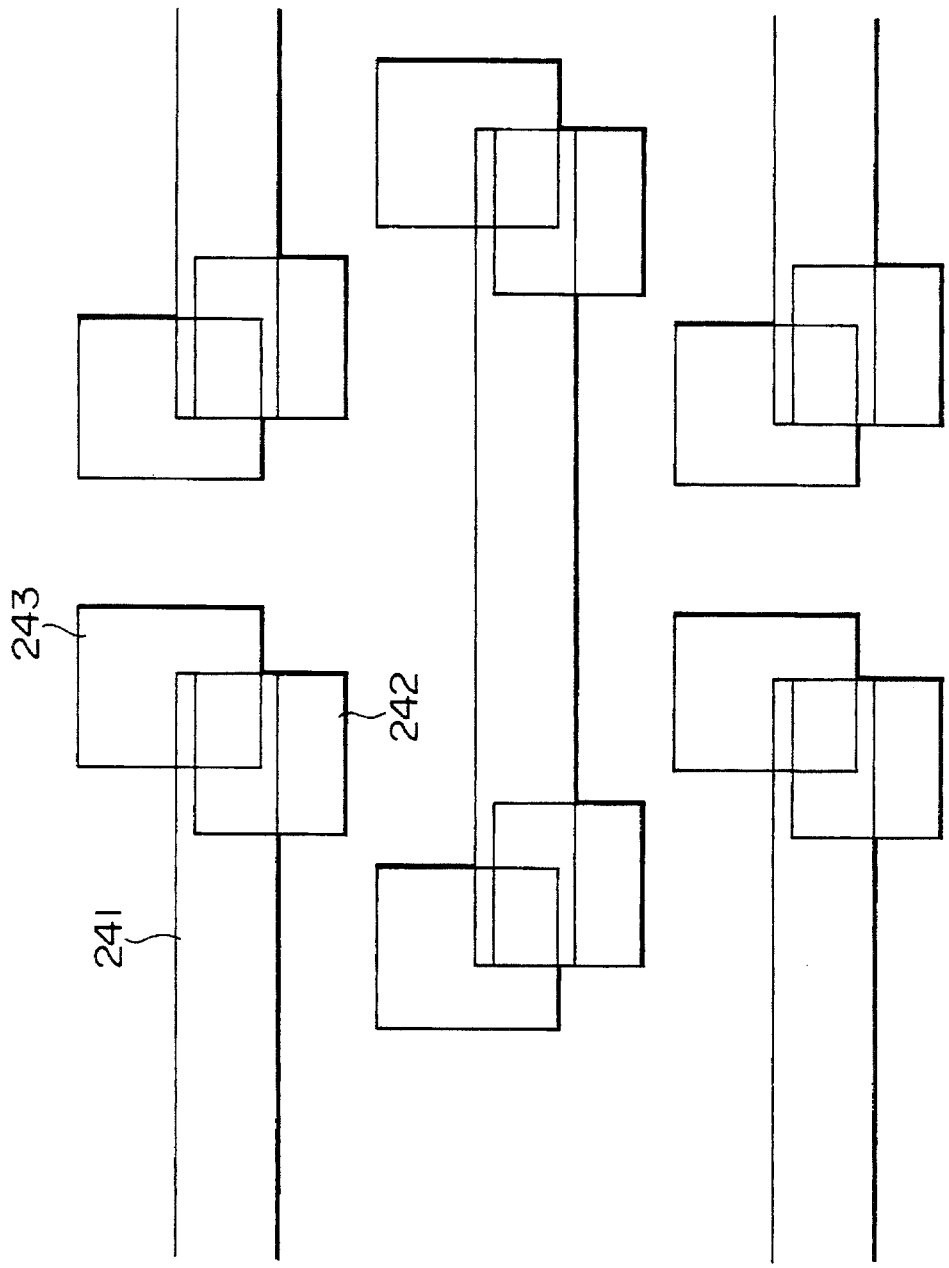
FIG. 2 illustrates the positional relationship between an opening in the mask pattern for the trench and an opening in the storage node contact with respect to an opening in the mask pattern for an element region of the DRAM shown in FIG. 1.

FIG. 2 shows the positional relationship between openings 243 and 242 in a mask pattern for the trench and in the storage node contact with respect to an opening 241 in a mask pattern for the element region.

Figure 7A:
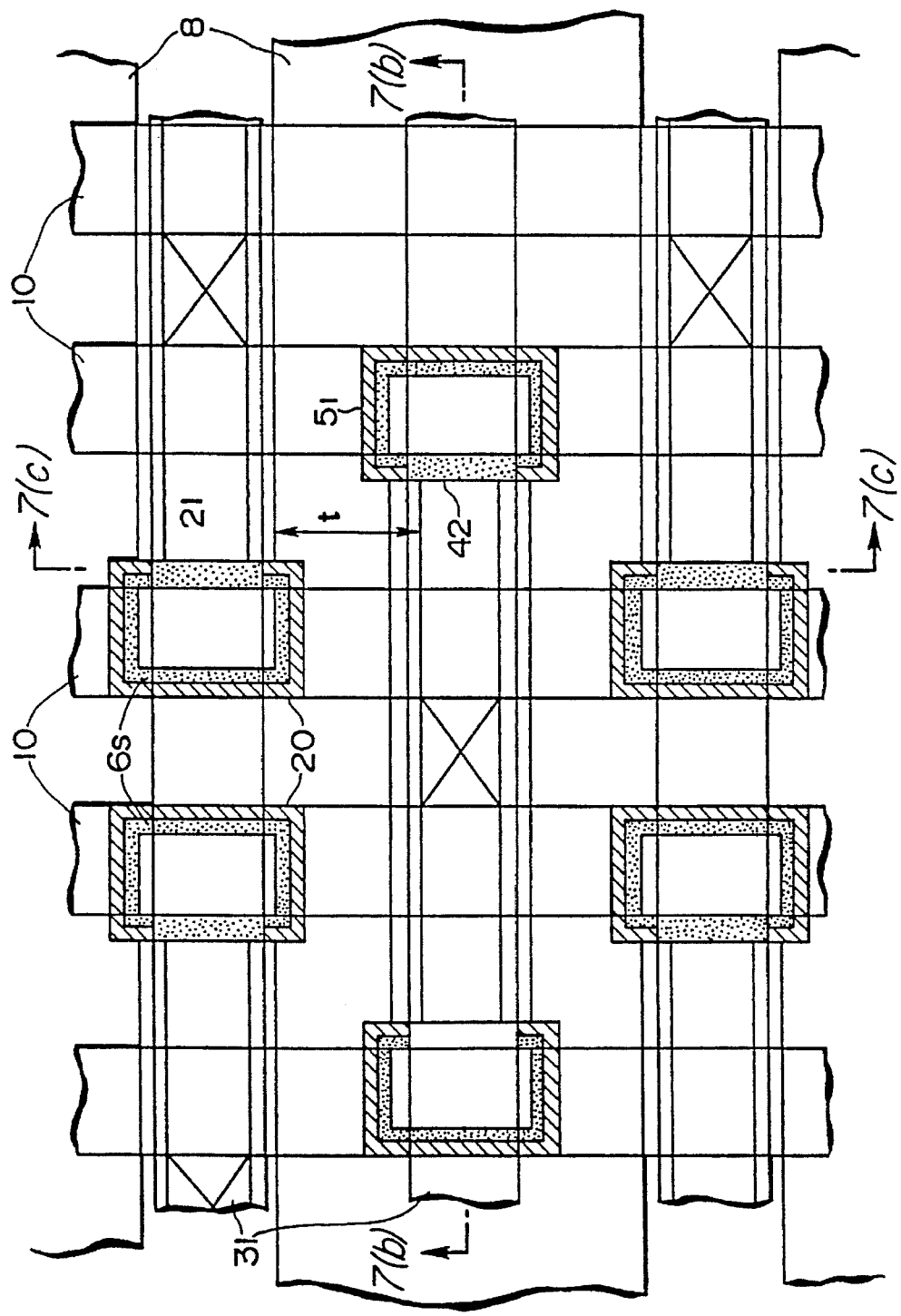
Figure 8:
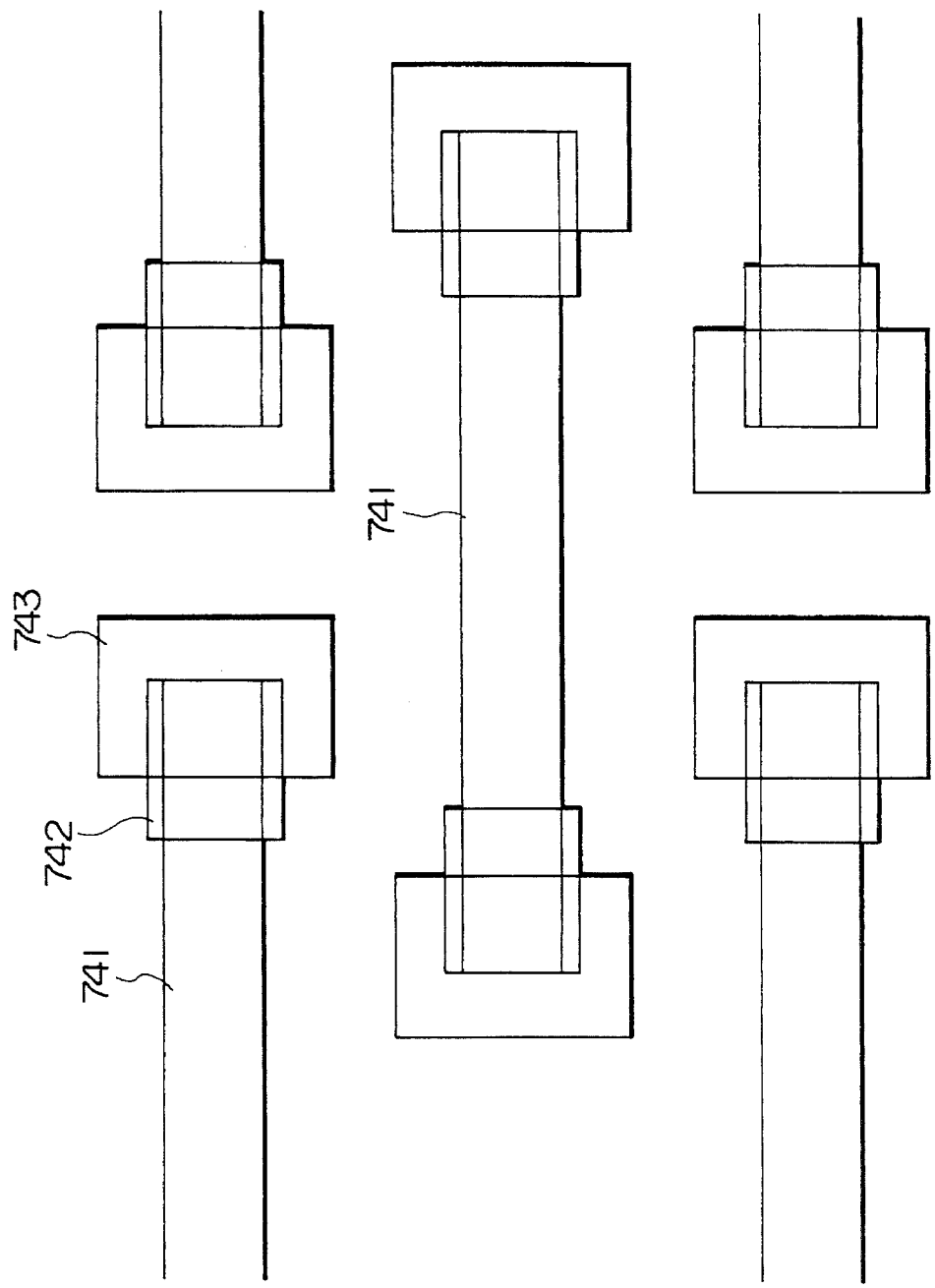
FIG. 8 illustrates the positional relationship between openings the trench mask pattern and storage node contact with respect to an opening in the mask pattern for the element region of the conventional DRAM shown in FIG. 7.

Similar to the structure of a conventional DRAM shown in FIG. 7, a DRAM in FIG. 1 includes MOSFETs and MOS capacitors. A MOSFET is formed in an element separating region separated by an element separating field oxide film 103 formed on a p-type silicon 101 and comprises a gate electrode 110 formed via a gate insulator film 109 on the substrate 101, and source/drain regions 111 and 112 of an n-type layer formed in the substrate 101 in a self-alignment manner to the corresponding gate electrode, and a MOS capacitor comprises a storage node electrode 106 made of a polycrystalline silicon film formed via a thermal oxide film 120 in the trench 105 so as to be connected to the source/drain region 112, a capacitor insulator film 107 of a double-layered structure made of a silicon nitride film and a silicon oxide film formed on a surface of the storage node electrode 106, and a plate electrode 108 made of a polycrystalline silicon film embedded in the trench 105.

An n-type layer 121 is formed so as to be connected to the storage node electrode 106 and to one of the source/drain regions 112 of the MOSFET. The other of the source/drain regions 111 is connected to a bit line 131.

The gate electrode 110 extends in one direction of a memory cell matrix to constitute a word line.

The upper surface of the element region thus formed is covered with a silicon oxide film 119 by the CVD process, and a bit line 131 is formed on the upper surface of silicon oxide film 119. The bit line 131 is connected to the n-type layer through a contact hole.

The process for manufacturing the DRAM will next be described.

First, as shown in FIG. 3(a), a surface of the p-type silicon substrate 101 having a resistivity of about 5 Ω cm is subjected to field oxidation using the LOCOS process to form an element separating insulator film 103 made of a silicon oxide film having a thickness of 500 nm. A trench 105 is formed using a trench mask made of a double-layered film of a silicon nitride film 152 and a silicon oxide film 153 by the anisotropic etching. A silicon oxide film 120 having a thickness of 800 Å is formed on the inner wall of the trench 105 by thermal oxidization. A resist pattern R is formed for the formation of a storage node contact 141. As shown in FIG. 2, the trench mask has the opening 243 which is deviated from the element region 151 and the opening 242 in the resist pattern R for forming the storage node contact 141 is deviated from the element region in the direction opposite to the direction in which is the opening 243 of the trench mask deviates.

The silicon oxide film 120 on the side wall of the trench 105 is etched away as shown in FIG. 3(b) by the isotropic etching with ammonium fluoride (NH₄OH) using a resist pattern as a mask, and then the resist pattern R is removed. Subsequently, the films 152 and 153 of the trench mask are removed.

The double-layered trench mask 152 and 153 are removed as follows.

After the removal of the resist pattern R, the exposed surface is oxidized, which is then covered with a silicon oxide film 154 having a thickness of about 150 Å and a silicon nitride film is filled into the trench. The side wall of the field oxide film 103 is left and protected with the silicon nitride film. Then, the product surface is treated with ammonium fluoride to remove the silicon oxide film 153.

Thereafter, the silicon nitride film is removed by the CDE process (Chemical Dray Etching). Lastly, the surface is subjected to a slight ammonium fluoride process to remove the thin silicon oxide film 154 in the contact of the storage node electrode to thereby expose the substrate.

After the trench mask is removed in the above-described manner, polycrystalline silicon of about 50 nm thickness is deposited by the CVD process and doping is made by the ion implantation of arsenic or phosphorus or the diffusion of phosphorus so as to form the storage node electrode 106 as shown in FIG. 3(c). At this time, a diffusion layer 121 is formed in a region where the side wall of the trench contacts with the substrate 101.

In the trench 105, the capacitor insulator film 107 of a double-layered structure made of a silicon nitride film and a silicon oxide film is formed and a polycrystalline silicon film is embedded. Then, the plate electrode 108 is formed by patterning.

Subsequently, as shown in FIG. 3(d), the silicon nitride film of the capacitor insulator film is etched away by the reactive on etching process using the pattern of the plate electrode 108 as a mask. The plate electrode surface is oxidized by low temperature oxidization to form a silicon oxide film as an inter-layer insulator film. The silicon oxide film is patterned with ammonium fluoride using a resist pattern as the mask. Thus, a MOS capacitor is formed in the trench.

Then, a MOS transistor is formed in a conventional manner as follows. A gate insulator film 109 including a thermal oxide film of a about 150 nm thickness is first formed, a polycrystalline silicon film as the gate electrode 110 is deposited, and a photoresist pattern is formed in a region in the trench which extends in the direction of the word line. Subsequently, a pattern is formed by reactive ion etching using the photoresist pattern as a mask to thereby form a gate electrode 110 which functions as a word line.

Thereafter, the substrate surface is exposed by the photolithography and the reactive ion etching, arsenic ions are implanted to form the n-type layers 111 and 112 as the source or drain of a MOS transistor.

Then, the overall surface is covered with an interlayer insulator film 119 made of a silicon oxide film by the CVD process.

Finally, a contact hole is formed in the interlayer insulator film, and a film, for example, of polycrystalline silicon or aluminum is deposited to dispose a bit line 131 by photolithography or patterning to complete a DRAM.

As described above, according to the DRAM of the embodiment of the present invention, the trench $105_2$ formed in the element region $151_2$ is provided so as to deviate from the longitudinal centerline of the element region 151 toward the element region $151_1$ and the storage node contact $141_2$ is formed so as to deviate from the longitudinal centerline of the region 151 toward the element region $151_3$ in the trench, so that substantially no leakages occur between the n-type layer $121_2$ formed in the storage node contact and the adjacent element region $151_3$ even if misalignment of the masks used in the patterning may occur.

As a result, even if the inter-element region distance (the width of the element separating region) is reduced and the element region is increased, substantially no leakage occur, and hence a miniaturized high reliable DRAM is obtained. Further, since the patterning of the storage node contact and the trench can be performed in large size, DRAMS are manufactured relatively easily.

The present invention is not limited to the structure of the above embodiment and is modifiable. Such modifications are shown in FIGS. 4(a) and 4(b) and FIGS. 5(a) and 5(b).

Figure 4A:
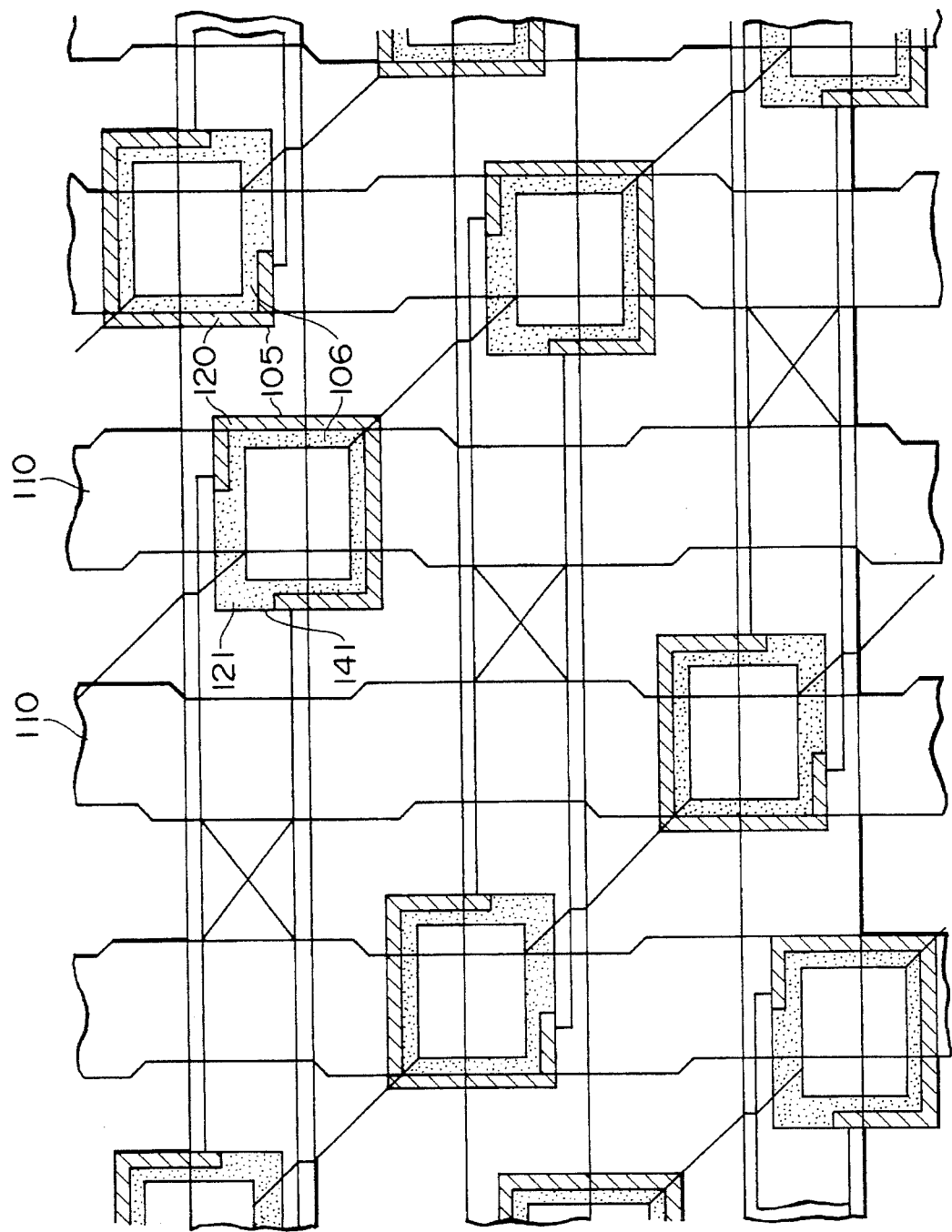
Figure 5A:
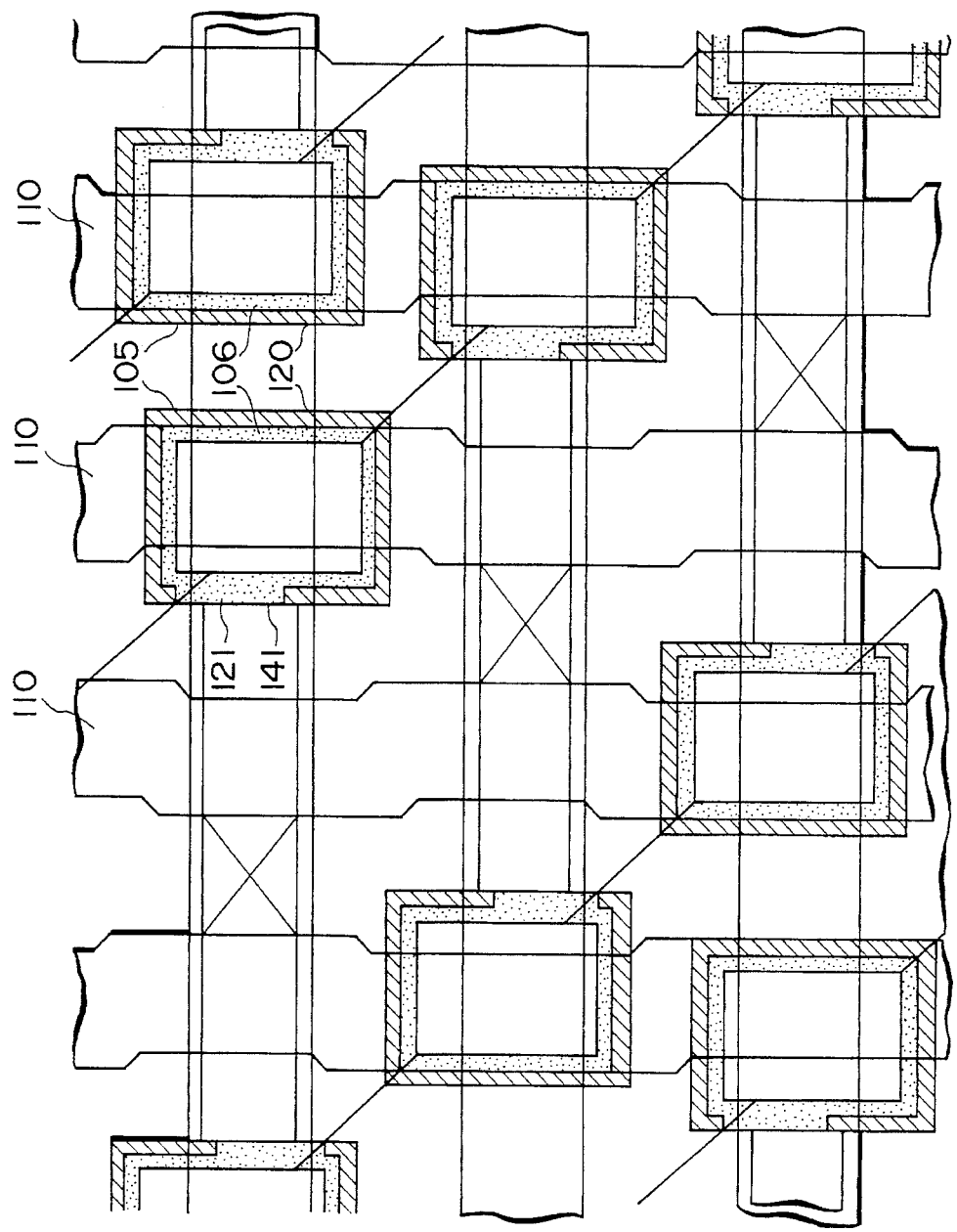
Figure 5B:
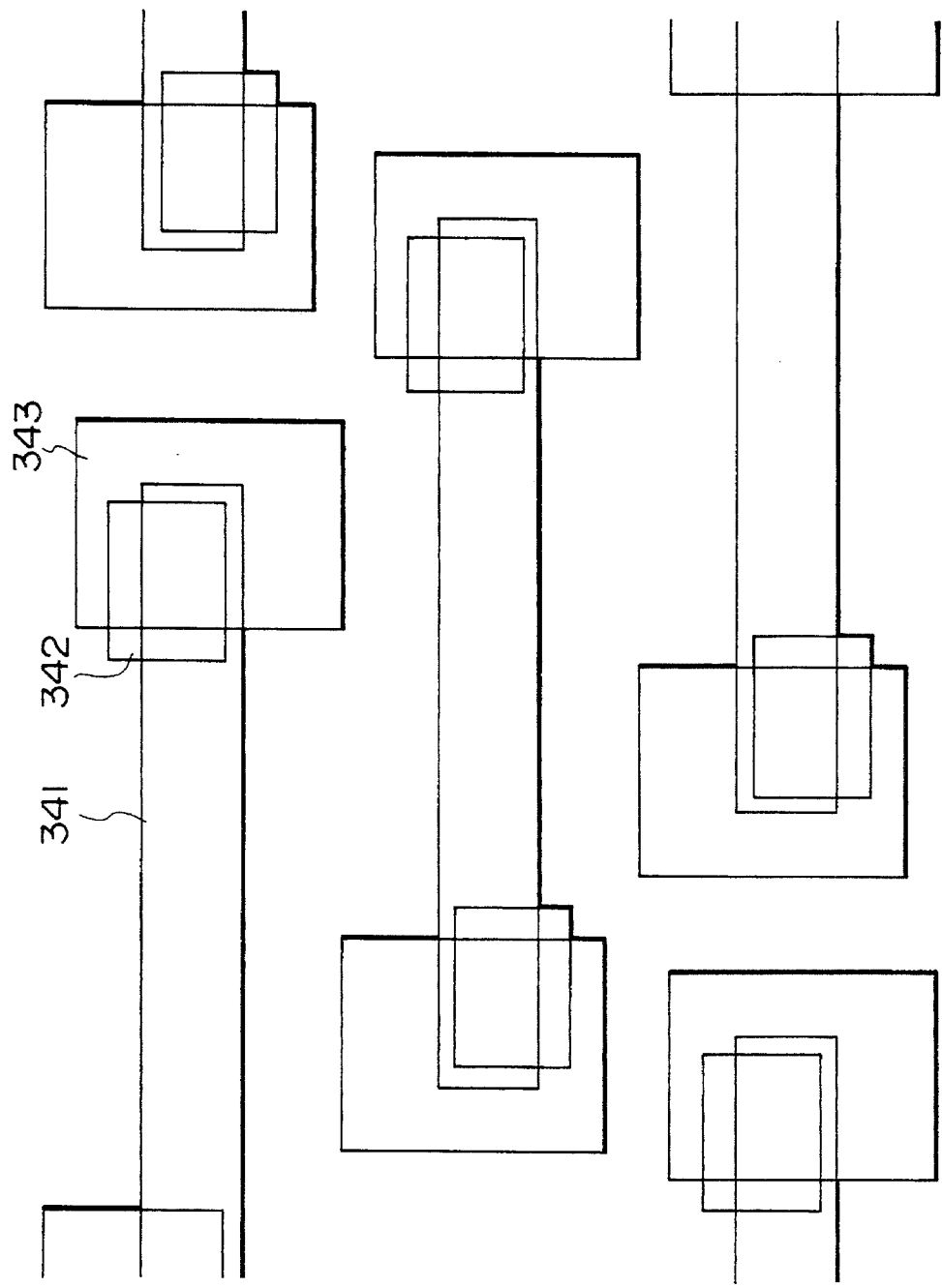
Figure 6A:
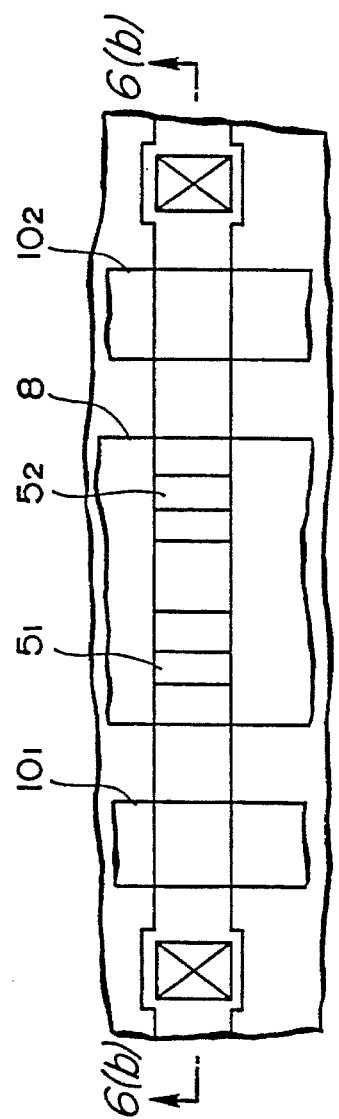
Figure 6B:
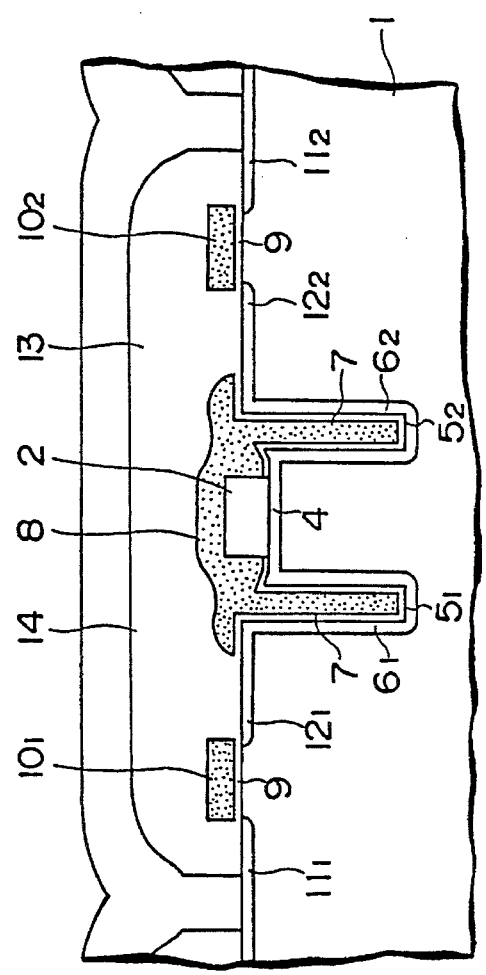

FIG. 4(a) and FIG. 5(a) are plan views of modifications of the present invention and FIG. 4(b) and FIG. 5(b) show the positional relationship between an opening 341 of a mask for element region formation, an opening 342 of a mask for storage node contact formation and an opening 343 of a mask for trench formation.

In the modification of FIGS. 4(a) and 4(b), the memory cells in the corresponding adjacent bit lines deviate by a ¼ pitch from each other. In the modification of FIGS. 5(a) and (b), the memory cells in the corresponding adjacent bit lines deviate by a ¼ pitch from each other and a storage node contact 141 is formed only on one side of the trench 105.

In the cell arrangement of FIGS. 4 and 5, substantially no such leakage occurs only if the trench is caused to deviate even if the storage node contact is not caused to deviate.

Although in the above described embodiment and modifications, the trench and the storage node contact are square-shaped as viewed from the top, they may be circular.

While in the embodiment, the source/drain regions are of n-type, the present invention is applicable also when the source/drain regions are of p-type. In this case, the n-type layer 121 becomes a p-type layer.

What is claimed is:

1. A semiconductor memory device comprising a plurality of memory cells, each comprising:

a MOSFET element region including a source region, and a drain region, and a gate, the source region and the drain region being of a first conductivity type and formed in a surface of a substrate of a second conductivity type at positions aligned with a longitudinal centerline of the element region that is parallel to a centerline of a bit line, the gate being formed between the source region and the drain region;

a trench having an inside wall and formed in the substrate at a position centered in deviated relation to the longitudinal centerline of the element region; and a capacitor including a storage node electrode, a capacitor insulator film, and a plate electrode, the storage node electrode being formed on an insulation film provided on the inside wall of the trench and in contact with the source region or the drain region through a storage node contact formed in the insulation film, the capacitor insulator film and the plate electrode being successively laminated on the storage node electrode.

2. A semiconductor memory device according to claim 1, wherein the storage node electrode is connected to one of the source region and the drain region through a diffusion layer of the first conductivity type.

3. A semiconductor memory device according to claim 1 or 2, wherein the storage node contact is formed in the insulation film centered in a position deviated from the longitudinal centerline of the element region, and in a direction opposite to the direction in which the trench is deviated from the longitudinal centerline.

4. A semiconductor memory device according to claim 1 or 2, wherein the memory cells are arranged in such a manner that two adjacent memory cells are deviated from each other in a direction in a direction in which bit lines are disposed and at a distance of one fourth of a distance between adjacent bit lines.

5. A semiconductor memory device according to claim 4, wherein the storage node contact is formed on a single side of the trench.

6. A semiconductor memory device on a substrate comprising a plurality of memory cells, each comprising:

a MOSFET having a gate electrode connected to a word line extending in a first direction and a source/drain region provided on the substrate and arranged in a second direction perpendicular to the first direction; and a trench capacitor having a first capacitor electrode, a second capacitor electrode, and a capacitor insulator disposed between the first and second electrodes, the trench capacitor coupled to said source/drain region through a storage node contact, said trench capacitor deviated by a predetermined distance in the first direction from a longitudinal centerline of the source/drain region extending in the second direction.

7. A semiconductor memory device according to claim 6, further comprising a plurality of bit lines coupled to said source/drain regions of respective ones of the memory cells.

8. A semiconductor memory device according to claim 7, wherein said trench capacitor of each respective said memory cell is arranged asymmetrically to the bit line coupled to said source/drain region.

9. A semiconductor memory device according to claim 6, wherein one of said first and second capacitor electrodes of said trench capacitor is the storage node contact coupled to said source/drain region through a diffusion layer.

10. A semiconductor memory device according to claim 6, wherein the storage node contact is positioned at a side of said trench capacitor opposite from the first direction of the deviation of the trench capacitor from the longitudinal centerline.

11. A semiconductor memory device according to claim 7, wherein the memory cells are arranged such that an adjacent two of the memory cells in the second direction are deviated from each other in the first direction by a distance equal to one fourth of a pitch of said plurality of bit lines extending in the second direction.

* * * * *